(12) United States Patent
Davis et al.

(10) Patent No.: US 10,859,650 B2
(45) Date of Patent: Dec. 8, 2020

(54) METHODS FOR DETERMINING PLANT RUBBER CONTENT WITH LOW FIELD NMR

(71) Applicant: Bridgestone Corporation, Chuo-ku (JP)

(72) Inventors: Michael C. Davis, Independence, OH (US); Yingyi Huang, Hudson, OH (US)

(73) Assignee: Bridgestone Corporation, Chuo-ku (JP)

( * ) Notice: Subject to any disclaimer, the term of this patent is extended or adjusted under 35 U.S.C. 154(b) by 280 days.

(21) Appl. No.: 15/637,254

(22) Filed: Jun. 29, 2017

(65) Prior Publication Data

US 2018/0003785 A1    Jan. 4, 2018

Related U.S. Application Data

(60) Provisional application No. 62/356,272, filed on Jun. 29, 2016.

(51) Int. Cl.
| | | |
|---|---|---|
| *G01N 24/08* | (2006.01) | |
| *G01R 33/465* | (2006.01) | |
| *G01R 33/46* | (2006.01) | |
| *C08L 7/00* | (2006.01) | |
| *C08L 9/00* | (2006.01) | |
| *C08F 36/00* | (2006.01) | |
| *G01R 33/44* | (2006.01) | |

(52) U.S. Cl.
CPC ............ *G01R 33/465* (2013.01); *C08F 36/00* (2013.01); *C08L 7/00* (2013.01); *C08L 9/00* (2013.01); *G01N 24/08* (2013.01); *G01R 33/4616* (2013.01); *G01R 33/445* (2013.01); *G01R 33/4625* (2013.01)

(58) Field of Classification Search
CPC ..................................................... G01N 24/08
USPC ......................................................... 436/173
See application file for complete search history.

(56) References Cited

U.S. PATENT DOCUMENTS

| | | |
|---|---|---|
| 5,321,111 A | 6/1994 | Ji |
| 7,564,245 B2 | 7/2009 | Lee |
| 8,102,176 B2 | 1/2012 | Lee |
| 8,624,599 B2 | 1/2014 | Kamlowski et al. |
| 8,940,849 B2 | 1/2015 | Feher et al. |
| 8,962,759 B2 | 2/2015 | Mazumdar et al. |
| 9,046,493 B2 | 6/2015 | Neely et al. |

FOREIGN PATENT DOCUMENTS

JP            4500529  B2    7/2010

OTHER PUBLICATIONS

Golub, M. A. et al, Journal of the American Chemical Society 1962, 84, 4981-4982.*
Tonnet, M. L. et al, Journal of the Science of Food and Agriculture 1983, 34, 169-174.*
Bhatia, V. K. et al, Journal of Scientific and Industrial Research 1983, 42, 273-280.*
Miller, J. M. et al, Economic Botany 1986, 40, 366-374.*
Ferraris, R. et al, Journal of the Science of Food and Agriculture 1992, 58, 577-579.*
Thudium, R. N. et al, Macromolecules 1996, 29, 2143-2149.*
Bultman, J. D. et al, Industrial Crops and Products 1998, 8, 133-143.*
Somers, A. E. et al, Polymer Degradation and Stability 2000, 70, 31-37.*
Saalwachter, K., Journal of the American Chemical Society 2003, 125, 14684-14685.*
Benedict, C. R. et al, Industrial Crops and Products 2008, 27, 225-235.*
Tuampoemsab, S. et al, Polymer Testing 2015, 43, 21-26.*
Chen, H. Y., Analytical Chemistry 1962, 34, 1134-1136.*
Rackham, D. M., Talanta 1970, 17, 895-906.*
Haighton, A. J. et al, Journal of the American Oil Chemist Society 1972, 49, 153-156.*
Bowen, M. H. et al, Proceedings of the Society for Analytical Chemistry 1974, 11, 294-297.*
Cockerill, A. F. et al, Organic Magnetic Resonance 1974, 6, 452 to 453.*
O'Neill, I. K. et al, Journal of Pharmacy and Pharmacology 1975, 27, 222-225.*
Brame, E. G. et al, Analytical Chemistry 1976, 48, 709-711.*
Madsen, E., Journal of the American Oil Chemist Society 1976.*
Hayman, E. et al, Journal of Agriculture and Food Chemisrty 1982, 30, 399-401.*
Jambunathan, R. et al, Journal of the Science of Food and Agriculture 1985.36,162-166.*
Klein, W., American Journal of Physics 1990, 58, 143-147.*
Peterson, J. et al, Journal of CHemical Education 1992, 69, 843-845.*
Ghambir, P.N. et al, Journal of Natural Rubber Research 1993, 8, 208-212.*
de Graaf, R. A. et al, Starch 1995, 47, 469-478.*
Pauli, G. F. et al, Journal of Natural Products 2005, 68, 133-149.*
Malz, F. et al, Journal of Pharmaceutical and Biomedical Analysis 2005, 38, 813-823.*
Bharti, S. K. et al, Trends in Analytical Chemistry 2012, 35, 5-26.*
Pauli, G. F. et al, Journal of Natural Products 2012, 75, 834-851.*

(Continued)

*Primary Examiner* — Arlen Soderquist
(74) *Attorney, Agent, or Firm* — Meredith E. Hooker; J. Gregory Chrisman

(57) ABSTRACT

Methods are described for quantifying an amount of natural rubber in a plant from a sample of the plant by obtaining a NMR spectrum and analyzing the signal peaks for the natural rubber in the plant sample and a standard component tested in combination with the plant sample. The NMR testing is conducted on a liquid state sample of a solution containing dissolved plant sample and standard component. A pre-determined and known amount of standard component is present in the liquid state sample and provides a reference for calculating an estimated amount of natural rubber in the plant sample. The estimated amount of natural rubber in the sample can be used to quantify the amount of extractable rubber in the sampled plant.

19 Claims, 4 Drawing Sheets

(56) References Cited

OTHER PUBLICATIONS

Rundlof, T. et al, Journal of Pharmaceutical and Biomedical Analysis 2014, 93, 111-117.*
Pages, G. et al, Analytical Chemistry 2014, 86, 11897-11904.*
Kishore, K. et al, Journal of Polymer Science: Polymer Letters 1986, 24, 393-397.*
Bamba, T. et al, Zeitschrift für Naturforschung 2007, 62c, 579-582.*
Chen, R. et al, BMC Biotechnology 2012, 12, paper 78, 12 pages.*
Chen, H. Y. et al, Analytical Chemistry 1964, 36, 1394-1396.*
Kennedy, J. F. et al, British Polymer Journal 1984, 16, 5-10.*
Pauli, G. F., Phytochemical Analysis 2001, 12, 28-42.*
Yang, M. et al, Journal of Pharmaceutical and Biomedical Analysis 2012, 70, 87-93.*
Tanaka, Y. et al, Polymer 1975, 16, 709-713.*
Tanaka, Y. et al, Makromolekulare Chemie 1977, 178, 1823-1832.*
Belmares, H. et al, Industrial & Engineering Chemistry Product Research and Development 1980, 19, 107-111.*
Amiya, S. et al, Polymer Journal 1980, 12, 287-292.*
van Emon, J. et al, Economic Botany 1985, 139, 47-55.*
Nurthen, E. J. et al, Analyutical Chemistry 1986, 58, 448-453.*
Salman, S. R. et al, Polymer-Plastics Technology and Engineering 1989, 28, 1009-1014.*
Maenz, K. et al, European Polymer Journal 1993, 29, 855-861.*
Craig, S. W. et al, Macromolecules 2001, 34, 7929-7931.*
Nordon, A. et al, Applied Spectroscopy 2002, 56, 75-82.*
Viol, M. et al, SAE Technical Paper 2004-01-0870, 2004, 9 pages.*
Pauli, G, F. et al, Journal od Natural Products 2007, 70, 589-595.*
Demas, V. et al, Journal of Magnetic Resonance 2007, 189, 121-129.*
Teetor, V. H. et al, Industrial Crops and Products 2009, 29, 590-598.*
Rundlöf, T. et al, Journal of Pharmaceutical and Biomedical Analysis 2010, 52, 645-651.*
Barding Jr. G. A. et al, Analytical and Bioanalytical Chemistry 2012, 404, 1165-1179.*
Mahajan, S. et al, Magnetic Resonance in Chemistry 2013, 51, 76-81.*
van Duynhoven, J. et al, Annual Reports on NMR Spectroscopy 2013, 80, 181-236.*
Post, J. et al, Journal of Molecular Catalysis B: Enzymatic 2014, 103, 85-93.*
Makhiyanov, N. Polymer Science, Ser. A, 2014, 56, 241-255.*
Parker, T. et al, Trends in Analytical Chemistry 2014, 57 147-158.*
Jakes, W. et al, Food Chemistry 2015, 175, 1-9.*
Smolentseva, I. I. et al, Journal of Applied Spectroscopy 2015, 82,465-469.*
Black.et al.; Gravimetric Analysis for Determining the Resin and Rubber Content of Guayule; Rubber Chem & Tech, vol. 56, Issue 2, May 1983.
Lopez; Microstructure of Natural Guayule Robber from 300-MHz Nuclear Magnetic resonance Spectra; Journal of Polymer Science 1976, Polymer Chem. vol. 14, Issue 6, pp. 1561-1563.
Macrae et al.; Rubber Production in Guayule: Determination of Rubber Producing Potential; PLlant Physiol. 1986 No. 81, pp. 1027-1032.
Schmidt et al., Characterization of Rubber Particles and Rubber Chain Elongation in Taraxacum Koksaghyz; BMC Biochemistry, 2010, 11:11.
Spano, et al.; Extraction and Characterization of a Natural Rubber from Euphorbia; Biopolymers 2912, Aug. 1997, No. 8, pp. 589-594.
Visintainer et al; Determination of Rubber Content in Guayule Bushes by Carbon0-13 Nuclear Magnetic Resonance Spectrometry; Anal Chem, 1981, No. 53, 1570-1572.
Suchat, et al.; Fast Determination of the resin and rubber content in Parthenium argentatum biomass using near infrared spectroscopy, Industrial Crops and Products, 2013, No. 45, pp. 44-51.
Coates, et al.; Guayule rubber and latex content—seasonal variations over time in Argentina; Industrial Crops and Products, 2001, No. 14, pp. 85-91.

* cited by examiner

| Sample | Initial Volume (mL) | Aliquot | Wt. Vial + Residue | Wt. Vial + Res. + 1,4 BD Std. | Wt. Vial + Res. + 1,4 BD, + CDCl3 | Density of CDCl3 (g/mL) | Mass 1,4 BD (g) | Moles 1,4 BD | Volume CDCl3 |
|---|---|---|---|---|---|---|---|---|---|
| 1 | 2 | 1 | 26.3248 | 26.3356 | 27.8303 | 1.49 | 0.0108 | 0.0002 | 1.003154362 |
| 2 | 2 | 1 | 25.9492 | 25.9597 | 27.583 | 1.49 | 0.0105 | 0.000194444 | 1.089463087 |
| 3 | 2 | 1 | 26.8427 | 26.8576 | 28.4752 | 1.49 | 0.0149 | 0.000275926 | 1.085637584 |
| 4 | 2 | 1 | 26.1373 | 26.1489 | 27.655 | 1.49 | 0.0116 | 0.000214815 | 1.010805369 |
| 5 | 2 | 1 | 26.0847 | 26.1014 | 27.7051 | 1.49 | 0.0167 | 0.000309259 | 1.076308725 |
| 6 | 2 | 1 | 26.8606 | 26.8708 | 28.5248 | 1.49 | 0.0102 | 0.000188889 | 1.110067114 |
| 7 | 2 | 1 | 26.0428 | 26.055 | 27.6532 | 1.49 | 0.0122 | 0.000225926 | 1.07261745 |
| 8 | 2 | 1 | 26.1245 | 26.1353 | 27.7555 | 1.49 | 0.0108 | 0.0002 | 1.08738255 |
| 9 | 2 | 1 | 26.8199 | 26.8277 | 28.42 | 1.49 | 0.0078 | 0.000144444 | 1.068657718 |
| 10 | 2 | 1 | 26.0757 | 26.0879 | 27.6912 | 1.49 | 0.0122 | 0.000225926 | 1.076040268 |
| 11 | 2 | 1 | 26.3218 | 26.3329 | 28.1401 | 1.49 | 0.0111 | 0.000205556 | 1.212885906 |
| 12 | 2 | 1 | 26.1072 | 26.1185 | 27.6062 | 1.49 | 0.0113 | 0.000209259 | 0.998456376 |
| 13 | 2 | 1 | 26.2355 | 26.2422 | 27.8635 | 1.49 | 0.0067 | 0.000124074 | 1.088120805 |
| 14 | 2 | 1 | 26.8441 | 26.8502 | 28.4422 | 1.49 | 0.0061 | 0.000112963 | 1.068456376 |
| 15 | 2 | 1 | 26.7667 | 26.7829 | 28.3725 | 1.49 | 0.0162 | 0.0003 | 1.066845638 |
| 16 | 2 | 1 | 27.0271 | 27.0396 | 28.683 | 1.49 | 0.0125 | 0.000231481 | 1.10295302 |
| 17 | 2 | 1 | 26.0973 | 26.1149 | 27.7047 | 1.49 | 0.0176 | 0.000325926 | 1.066979866 |
| 18 | 2 | 1 | 26.8934 | 26.9058 | 28.5301 | 1.49 | 0.0124 | 0.00022963 | 1.090134228 |
| 19 | 2 | 1 | 26.8202 | 26.8362 | 28.4565 | 1.49 | 0.016 | 0.000296296 | 1.087449664 |
| 20 | 2 | 1 | 26.1169 | 26.1258 | 27.7093 | 1.49 | 0.0089 | 0.000164815 | 1.062751678 |

FIG. 2A

| Sample | BR | NMR IR | NMR Conversion | mol IR | Mass IR (g) | Concentration (mg/mL) | Mass of Rubber in 25 mL (mg) |
|---|---|---|---|---|---|---|---|
| 1 | 1000 | 190.83 | 4E-07 | 7.6332E-05 | 0.00519058 | 5.2 | 129.4 |
| 2 | 1000 | 322.75 | 3.88889E-07 | 0.000125514 | 0.00853494 | 7.8 | 195.9 |
| 3 | 1000 | 144.76 | 5.51852E-07 | 7.98861E-05 | 0.00543225 | 5.0 | 125.1 |
| 4 | 1000 | 344.7 | 4.2963E-07 | 0.000148093 | 0.01007035 | 10.0 | 249.1 |
| 5 | 1000 | 173.75 | 6.18519E-07 | 0.000107468 | 0.0073078 | 6.8 | 169.7 |
| 6 | 1000 | 153.42 | 3.77778E-07 | 5.79587E-05 | 0.00394119 | 3.6 | 88.8 |
| 7 | 1000 | 126.97 | 4.51852E-07 | 5.73716E-05 | 0.00390127 | 3.6 | 90.9 |
| 8 | 1000 | 126.34 | 4E-07 | 5.0536E-05 | 0.00343645 | 3.2 | 79.0 |
| 9 | 1000 | 69.75 | 2.88889E-07 | 2.015E-05 | 0.0013702 | 1.3 | 32.1 |
| 10 | 1000 | 93.51 | 4.51852E-07 | 4.22527E-05 | 0.00287318 | 2.7 | 66.8 |
| 11 | 1000 | 210.94 | 4.11111E-07 | 8.67198E-05 | 0.00589694 | 4.9 | 121.5 |
| 12 | 1000 | 232.25 | 4.18519E-07 | 9.72009E-05 | 0.00660966 | 6.6 | 165.5 |
| 13 | 1000 | 195.79 | 2.48148E-07 | 4.85849E-05 | 0.00330377 | 3.0 | 75.9 |
| 14 | 1000 | 478.3 | 2.25926E-07 | 0.00010806 | 0.00734811 | 6.9 | 171.9 |
| 15 | 1000 | 159.17 | 6E-07 | 9.5502E-05 | 0.00649414 | 6.1 | 152.2 |
| 16 | 1000 | 155.28 | 4.62963E-07 | 7.18889E-05 | 0.00488844 | 4.4 | 110.8 |
| 17 | 1000 | 97.54 | 6.51852E-07 | 6.35816E-05 | 0.00432355 | 4.1 | 101.3 |
| 18 | 1000 | 110.1 | 4.59259E-07 | 5.05644E-05 | 0.00343838 | 3.2 | 78.9 |
| 19 | 1000 | 70.43 | 5.92593E-07 | 4.17363E-05 | 0.00283807 | 2.6 | 65.2 |
| 20 | 1000 | 109.02 | 3.2963E-07 | 3.59362E-05 | 0.00244366 | 2.3 | 57.5 |

FIG. 2B

METHODS FOR DETERMINING PLANT RUBBER CONTENT WITH LOW FIELD NMR

This application claims the benefit of U.S. provisional application Ser. No. 62/356,272 filed Jun. 29, 2016, the contents of which are incorporated herein in their entirety by reference.

TECHNICAL FIELD

The present invention relates to a method for quantifying an amount of natural rubber in a plant from testing an extract from the plant, and more particularly, taking liquid state, low-field NMR measurements of a sample generated by dissolving an extract from the plant in a solvent and adding a known amount of a rubber component to the solution.

BACKGROUND

Certain plants represent sustainable sources of natural rubber. Natural rubber can be extracted from such plants for use industry, for example, in the tire, medical and consumer products industries. Guayule is a perennial shrub that is a renewable source of natural rubber. The natural rubber extracted from guayule can replace petroleum-based synthetics and reduce reliance on imported natural rubber. The guayule is desirable because it advantageously requires relatively low amounts of water and pesticides, which reduces the costs of raising and harvesting this sustainable source of natural rubber. Another plant, the *Hevea* tree, is also a renewable source of natural rubber. The *Hevea* tree represents the primary source of natural rubber used in tire production.

Breeding and harvesting methods for rubber-bearing plants focus on maximizing the amount of available extractable rubber. Rapid screening methods for testing and estimating the amount of natural rubber in harvestable plants has proven difficult. For example, guayule, which has rubber throughout its plant tissues, often requires time intensive methods, such as solvent extraction and lengthy sample preparation, for estimating extractable rubber content. Sample preparation, extraction methods and long analysis times can substantially limit the number of analyses which can be completed each day. Further, methods based on the use of high resolution or high-field NMR spectrums require expensive and large equipment having strong magnets and cumbersome probe electronics that are not readily transportable to the field. Analysis time using high resolution NMR apparatuses is lengthy and thus such use is not suitable for rapid screening of plants, either in the lab or field. There remains a need for more robust and accurate methods for quantifying natural rubber in a plant, and further for rapid, field-ready methods for accurately quantifying the amount of natural rubber in plants that reduces the costs and lengthy analysis time associated with more sensitive laboratory equipment.

SUMMARY

In a first aspect, there is a method for quantifying an amount of natural rubber in a rubber-containing plant by use of low-field NMR. The method includes introducing a sample solution containing a sample portion of the plant, a solvent and a known amount of standard rubber into a sample receiving space of a low-field NMR apparatus; obtaining a NMR spectrum of the sample solution, the NMR spectrum includes a first signal peak corresponding to a single proton for the natural rubber present in the portion of the plant, the first signal peak having a first peak area, and a second signal peak corresponding to one or more protons for the standard rubber, the second signal peak having a second peak area; and quantifying an amount of natural rubber in the portion of the plant by multiplying the first peak area by a conversion factor to obtain an estimate of the number of moles of natural rubber in the plant portion, the conversion factor being the number of moles of the standard rubber in the sample solution divided by the second peak area divided by the number of protons corresponding to the second signal peak.

In an example of aspect 1, the method further includes the step of quantifying an amount of natural rubber in the sampled rubber-containing plant by dividing the quantified amount of natural rubber in the portion of the plant by the weight of the portion of the plant to obtain a natural rubber per weight factor and multiplying the natural rubber per weight factor by the total weight of the sampled rubber-containing plant.

In another example of aspect 1, the plant a guayule and the amount of quantified natural rubber in the sampled rubber-containing plant being the amount of extractable natural rubber contained the guayule plant being tested.

In another example of aspect 1, the method further includes comparing the amount of quantified natural rubber to a pre-determined threshold amount of rubber and making a decision to harvest the rubber-containing plant being tested.

In another example of aspect 1, the method further includes comparing the amount of quantified natural rubber to a pre-determined threshold amount of rubber and making a decision to breed the rubber-containing plant being tested.

In another example of aspect 1, the method is non-destructive to the plant wherein the portion of the plant used in the sample receiving space of the low-field NMR apparatus to quantify an amount of natural rubber in the plant is less than 5 weight percent of the plant.

In another example of aspect 1, the low-field NMR apparatus operates at a magnetic field strength of 2 T or less for obtaining the NMR spectrum for the sample solution.

In another example of aspect 1, the low-field NMR apparatus operates at a frequency of 90 MHz less for obtaining the NMR spectrum for the sample solution.

In another example of aspect 1, the method is performed on the sample solution in less than 10 minutes.

In another example of aspect 1, the rubber-containing plant is guayule and standard rubber is polybutadiene.

In another example of aspect 1, the solvent is a deuterated solvent containing an internal standard, for example, deuterated chloroform to TMS.

In another example of aspect 1, the portion of the plant has at least 1 weight percent resin based on the total weight of the portion of the plant in the sample solution introduced into the receiving space of the low-field NMR apparatus.

The first aspect may be provided alone or in combination with any one or more of the examples of the first aspect discussed above.

In a second aspect, provided herein is a non-destructive method for quantifying an amount of natural rubber in a guayule plant by use of low-field NMR. The method includes introducing a sample solution into a sample receiving space of a low-field NMR apparatus, the sample solution contains a dissolved portion of the guayule plant and a dissolved pre-determined known amount of moles of a standard component, and the low-field NMR apparatus operating at a magnetic field strength of 2 T or less for obtaining a NMR spectrum for the sample solution; obtaining a NMR spectrum for the sample solution, the NMR spectrum includes a first signal peak corresponding to a single proton position for the natural rubber present in the portion of the guayule plant, the first signal peak having a first peak area, and a second signal peak corresponding to one or more protons for the standard component, the second signal peak having a second peak area; quantifying the number of moles of the natural rubber in the guayule plant by multiplying the first peak area by a conversion factor to obtain an estimate of the number of moles of natural rubber in the plant portion, the conversion factor being the number of moles of the standard component in the sample solution divided by the second peak area divided by the number of protons corresponding to the second signal peak.

In an example of aspect 2, the method further includes deciding to harvest the guayule plant by comparing quantifying step to a natural rubber harvesting threshold.

In another example of aspect 2, the method further includes extracting the natural rubber from the harvested guayule plant.

The second aspect may be provided alone or in combination with any one or more of the examples of the second aspect discussed above, or with any one or more of the examples of the first aspect.

The accompanying drawings are included to provide a further understanding of principles of the invention, and are incorporated in and constitute a part of this specification. The drawings illustrate one or more embodiment(s), and together with the description serve to explain, by way of example, principles and operation of the invention. It is to be understood that various features disclosed in this specification and in the drawings can be used in any and all combinations. By way of non-limiting example the various features may be combined with one another as set forth in the specification as aspects.

BRIEF DESCRIPTION OF THE DRAWINGS

FIG. 2A shows a table of the data generated from analysis of the liquid state guayule shrub samples and the calculated concentration of natural rubber in the samples.

FIG. 2B shows a table of additional data generated from analysis of the liquid state guayule shrub samples of FIG. 2A and the calculated concentration of natural rubber in the samples.

DETAILED DESCRIPTION

Figure 1:
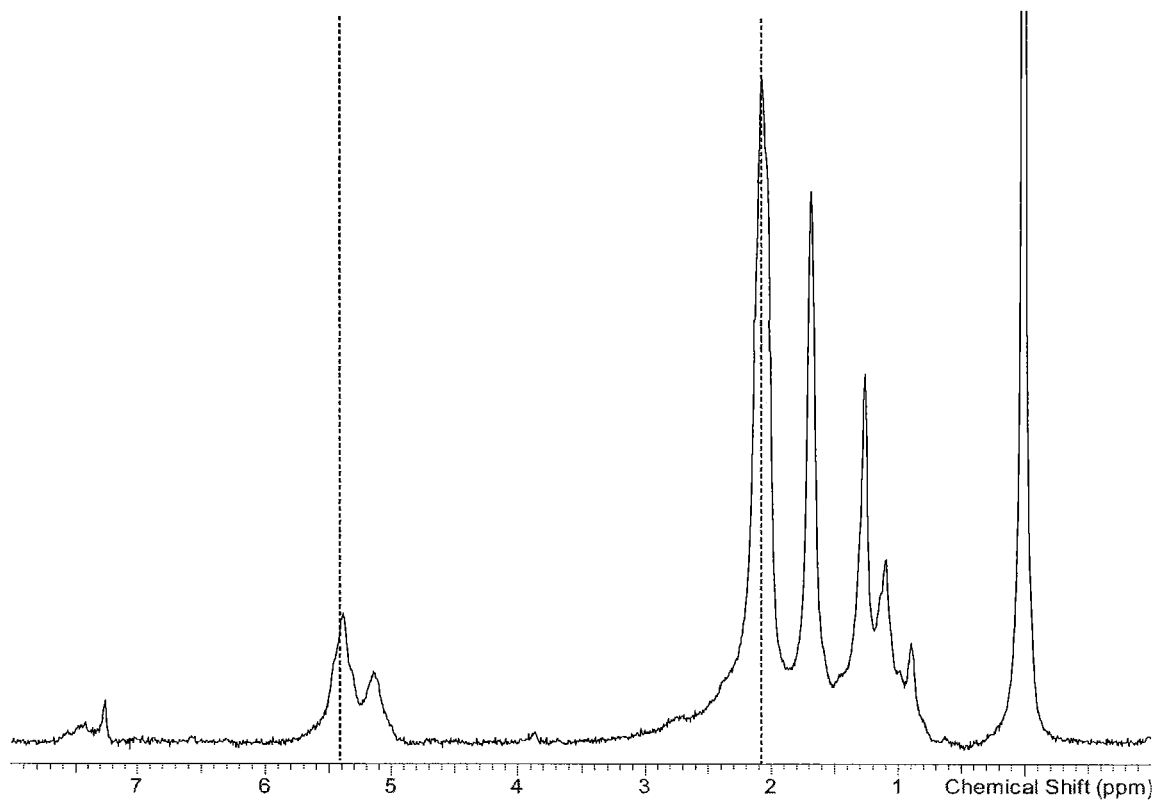
FIG. 1 shows a low-field $^1$H NMR spectrum for a liquid state extract of a guayule shrub sample.

Herein, when a range such as 5-25 (or 5 to 25) is given, this means preferably at least or more than 5 and, separately and independently, preferably not more than or less than 25. In an example, such a range defines independently at least 5, and separately and independently, not more than 25.

As used herein, "plant" refers to a rubber- or resin-bearing plant and preferably a sustainable rubber producing plant. The term rubber or natural rubber for a plant is also used interchangeably with polyisoprene herein. The plant can be a living, non-harvested plant from which a sample can be taken for testing with a low-field NMR apparatus. In another example, the plant can be a harvested and/or non-living wherein a sample of the plant can be prepared for use with a NMR apparatus. Examples of such plants include, but are not limited to, a guayule shrub (*Parthenium argentatum* Gray) and a *Hevea* tree (*Hevea brasiliensis*). Plant features that can be used for test samples can include any part or combination of parts of the plant, but are not limited to, the stem, leaves, bark, roots or combinations thereof.

The methods described herein can be non-destructive to the plant being tested. Such non-destructive methods are particularly useful to analyze a plant prior to harvesting or for breeding selection. The term "non-destructive" refers to a method for obtaining a sample from a plant for use with a NMR apparatus to quantify an amount of natural rubber or resin in the plant, wherein obtaining the sample does not cause significant harm to the plant or independently cause the plant to die. The non-destructive methods for quantifying an amount of natural rubber or resin in a plant can be used for selective breeding or harvesting purposes that can increase or maximize the amount of extractable rubber that can be obtained from the plants. The methods described herein can also be used to quantify or predict the amount of natural rubber or resin in a non-living or harvested plant. For instance, quantifying the amount of natural rubber in harvested plants, for example samples or extracts from multiple harvests, can predict or estimate the total amount of extractable rubber that a particular crop harvest can yield.

The NMR instruments used in the methods and examples described herein are low-field NMR apparatuses. For example, low-field NMR spectrometers or apparatuses that can record signals from natural rubber (i.e. polyisoprene) and resin present in plant samples. As used herein, the term "low-field" refers to an NMR apparatus that operates at a magnetic field strength of 0.5 to 2 Tesla ("T"), for example, 2 T or less, preferably 1.5 T or less and more preferably 1 T or less. The magnetic field strength of the low-field NMR spectrometers can be 1.8, 1.6, 1.4 or 1.2 T. The use of low-field magnets results in less-bulky, transportable NMR apparatuses that are field-ready and that can be used for rapid analysis and screening for quantifying the amount of natural rubber or resin in a plant. Preferably, the low-field NMR apparatus is capable of fitting on a benchtop or similar arrangement. A low-field NMR apparatus as described herein may also operate at a resonance frequency in the range of 20 MHz to 90 MHz, for example, 90 MHz or less, preferably 60 MHz or less and more preferably 40 MHz or less. One example of a low-field NMR apparatus is a 0.5 T benchtop Bruker minispec NMR spectrometer. Another example of a low-field NMR apparatus is an Oxford Pulsar 1.4 T benchtop spectrometer. The low-field NMR apparatus can be equipped with software (e.g., Matlab) for analyzing measured data to calculate weight percent natural rubber in the plant sample.

Disclosed are methods to quantify the amount of natural rubber in a plant, such as the guayule, using a low-field NMR apparatus. The methods may also be used to predict the amount of natural rubber in a rubber-containing plant. In one or more embodiments, the amount of can be extractable natural rubber that can be accurately quantified from a plant sample containing natural rubber. Preferably, the presence of resin in the sample does not impact the accuracy of quantifying natural rubber in a plant in a meaningful way. For example, the plant sample (e.g., a crude or raw plant sample) can be prepared without extraction or removal of resin present in the sample as harvested or obtained from the plant being tested. As described below, obtaining a liquid state $^1$H NMR spectrum from a low-field apparatus allows a tester to determine the presence and variant amounts of natural rubber in a sampled plant or a plurality of plants (e.g., a batch of plants that were planted at the same time or plants of a similar age) in a short period of time.

To test a plant, a portion of the plant must be taken and prepared for use with a low-field NMR apparatus. A plant sample or portion of the plant can include the bark, stem, leaves, root or a combination thereof. As an example, a section of a branch of a plant including stem, bark and leaves can be cut off and prepared to be analyzed in order to quantify the amount of natural rubber in the tested plant. The size of the plant sample can be adjusted to accommodate the particular NMR apparatus being used, for example, the plant sample can be in the range of 50 mg to 10 g dry weight. For use with conventional NMR tubes, such as a 5 mm or 10 mm sample tube, the plant sample to be analyzed can be in the range of 100 mg to 1 g dry weight. The sample size required to test and quantify the amount of natural rubber in a plant is preferably non-destructive to the plant, such as less than 0.1 to 10 weight percent of the sampled plant.

The portion of the plant to be analyzed with a NMR apparatus can have a water content in the range of 0.1 to 30 weight percent. The plant samples preferably have less than 30, 20, 10, 5, 4, 3, 2 or 1 weight percent of water content prior to testing with a NMR apparatus. To reduce the influence of moisture content on the measured relaxation rates, the plant sample can be dried and then dissolved in a suitable solvent prior to performing any relaxaometry. For example, samples can be dried in an oven, such as a vacuum oven, at a temperature of 50° to 100° C. for up to 24 hours. The sampled portion of the plant can be chopped and/or milled prior to testing, for example with a chipper, hammer mill or roller mill. The plant sample can have an average piece or particle size in the range of 0.1 to 10 mm such that a solvent can entirely or substantially dissolve the plant sample for NMR testing.

The plant sample or extract is prepared to test in the liquid state. Preferably, the prepared plant sample (e.g., a dry powder or particulate mixture) can include only plant sample material with no other non-plant materials or ingredients other than a dissolving solvent and rubber standard. The portion of the plant sample to be tested is dissolved in a suitable solvent to form a solution containing the plant sample and solvent. Solvents used to dissolve plant samples (e.g., a guayule plant sample) preferably contribute no interfering resonances. Solvents can be deuterated solvents, for example, with greater than 99.5% isotopic purity. Examples of deuterated solvents include deuterated chloroform, tetrachloroethane, dimethylsulfoxide, and toluene. Other examples of solvents can be those that contain an internal standard (e.g., tetramethylsilane (TMS) or trimethylsilylpropanoic acid (TSP)).

The plant sample solution is spiked with a rubber standard prior to NMR testing. For example, a known amount of a standard of a rubber component can be added to the plant sample solution to provide a sample reference. Any suitable rubber standard can be added to the plant sample solution, for instance, polybutadiene (e.g., 1,4 polybutadiene). The addition of a known mass of rubber standard allows the natural rubber content of a plant sample to be calculated. The amount of natural rubber in a plant can be quantified or predicted with the methods described herein by obtaining a liquid state $^1$H NMR spectrum.

The prepared plant sample can be introduced into the sample receiving space of a NMR apparatus to obtain spectrum data that can be transformed, processed and analyzed to quantify the amount of rubber in the tested plant or sample. Once the plant sample is prepared and ready for testing in the liquid state, the amount of natural rubber can be quantified with a NMR apparatus (e.g., a low-field NMR apparatus) by the methods described herein within a time period range of 1 to 10 and preferably in 1 to 5 minutes. In one or more embodiments, the methods herein provide a robust and efficient process for testing and screening rubber-bearing plants with short analysis times, for example, such time-sensitive methods that are not capable with high-field or high resolution NMR apparatuses. The use of low-field NMR apparatuses can also provide remote testing of plants in the field that eliminates the need to transport plant samples to a lab and possible lengthy testing with high-field devices.

The quantified amount of natural rubber in the plant sample and the estimate of amount of natural rubber in the tested plant can be used to make harvesting and breeding decisions. For example, the quantification or estimation of natural rubber in a rubber-containing plant or batch of plants, if above a pre-determined threshold for harvesting, can be used to make the decision to harvest the plant and extract the natural rubber for use in various applications. In another example, if the estimated amount exceeds a certain standard, a decision to selectively breed the plant can be made to promote the growth of plants having increased desirable rubber content.

In one embodiment, to quantify an amount of natural rubber in a plant or sample thereof, the obtained NMR spectrum can be used. FIG. 1 shows an example NMR spectrum obtained from testing a sample solution containing a guayule plant sample and a known amount of polybutadiene standard dissolved in a deuterated solvent. The standard component, in this case polybutadiene, preferably dissolves easily in the selected solvent and is nonvolatile. An NMR spectrum can have various peaks that can be used to calculate the amount of natural rubber in a plant sample. Polyisoprene can exhibit a multiple signal peak, for example at around 5.1 ppm (TMS reference), which corresponds to a single proton of the polyisoprene structure. The peak at 5.1 for the natural rubber in a plant sample can be the first peak having a first peak area for calculating the amount of natural rubber in a plant sample. The standard component will also exhibit signal peaks that correspond to one or more proton groups, for example, 2 protons of polybutadiene at around 5.4 ppm (TMS reference). The peak at 5.4 for the standard component can be the second peak having a second peak area for calculating the amount of natural rubber in a plant sample.

A first signal peak representing a proton group of the natural rubber in the plant sample can be multiplied by a conversion factor (moles per peak area) to quantify the number of moles present in the sampled plant portion of the solution. For example, a conversion factor can be calculated as follows: the known moles of standard component in the sample solution divided by the total of the peak area of a second signal peak representing one or more protons of a standard component divided by the number of protons for the second signal peak. The conversion factor (moles per peak area for a single proton) can be multiplied by the peak area of a single proton corresponding to the polyisoprene present in the plant sample.

The quantified amount of natural rubber in the plant sample can be further used to quantify the total natural rubber moles in the tested plant. For example, the quantity of natural rubber can be divided by the plant sample weight added to the sample solution to determine a weight percent of natural rubber for a given amount of plant material. This weight percent can be multiplied by the total plant weight to quantify a natural rubber content of the sampled plant, which can be used for harvest or breeding decisions.

In order to demonstrate the practice of the present disclosure, the following examples have been prepared and tested. The examples should not, however, be viewed as limiting the scope of the invention.

EXAMPLES

Example 1

Preparation of Liquid State Plant Sample

To prepare the liquid state plant sample, 20 individual 1 mL aliquots of a dried 25 mL guayule shrub extract were each dissolved in 1 mL of deuterated chloroform prior to NMR analysis. An internal standard of high cis polybutadiene of known mass was added to the solutions of guayule shrub extract and deuterated chloroform. The liquid state samples were analyzed by obtaining liquid state $^1$H NMR measurements on an Oxford Pulsar spectrometer operating at a field strength of 1.4 T (60 MHz for $^1$H).

Generation of NMR Spectrum

FIG. 1 shows the measured low-field $^1$H NMR spectrum of one of the liquid state samples. The presence of natural rubber in the guayule shrub extract was indicated in the low-field NMR spectra at resonances known for polyisoprene as labeled on the spectrum, for example, at 5.1, 2.1 and 1.6 ppm. The high cis polybutadiene (1,4 butadiene) internal standard added to the liquid state sample is also labeled on the spectrum by dotted vertical lines (2.1 and 5.4). For calculation, the first peak having a first peak area corresponds to the peak at 5.1 for the natural rubber in the guayule shrub extract and the second peak having a second peak area corresponds to the peak at 5.4 for the high cis polybutadiene (1,4 butadiene) internal standard added to the liquid state sample. Utilizing the known added mass of the internal standard of high cis polybutadiene, the concentration of natural rubber in the guayule shrub extract in the liquid state samples were calculated. The measurements and calculated concentration of natural rubber are reported in FIGS. 2A and 2B. FIGS. 2A and 2B provide the known amount of high cis polybutadiene added to each liquid sample and the calculated mass of natural rubber (IR) present in the guayule shrub extract in each sample.

Figure 3:
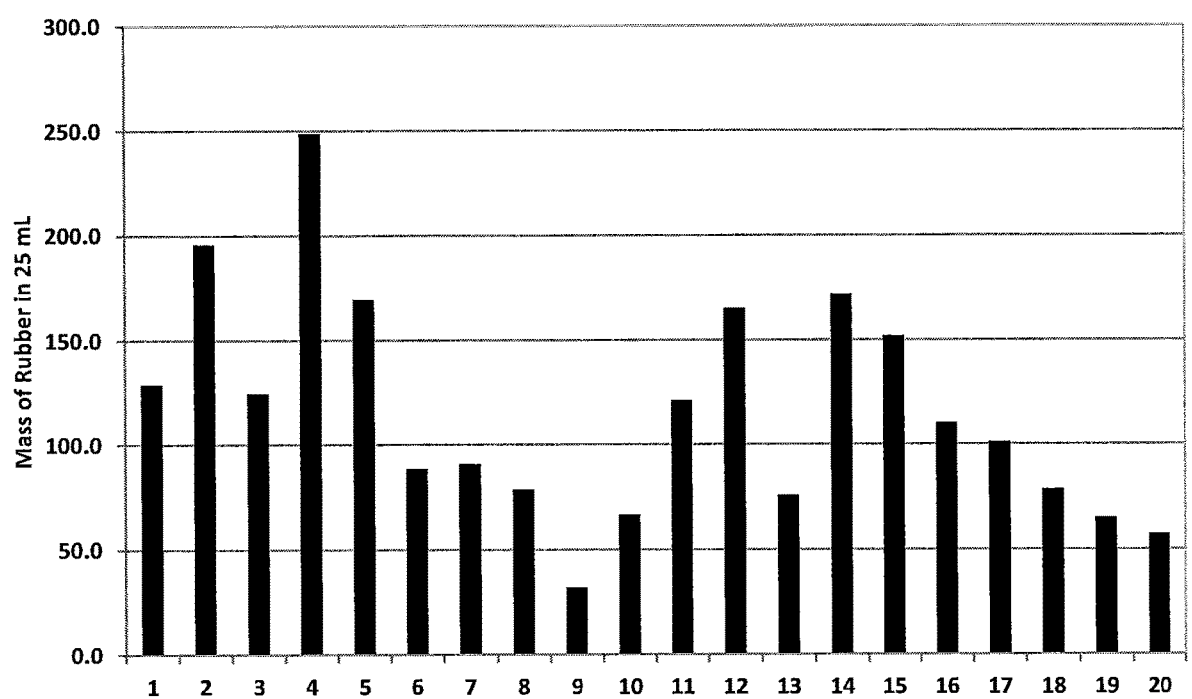
FIG. 3 shows a graph of the calculated amount of isoprene rubber in multiple liquid state extracts of guayule shrub samples measured by low-field $^1$H NMR.

FIG. 3 shows the calculated amount of natural rubber (mg) in each of the 20 tested 1 mL aliquots taken from the dried 25 mL guayule shrub extract.

TABLE 1

| Sample | Soxhlet Extraction #1 | Soxhlet Extraction #2 | Soxhlet Extraction #3 | Microwave Extraction | Low Field Solid State NMR | Low Field Liquid State NMR |
|---|---|---|---|---|---|---|
| 1 | 3.1 | 2.7 | 2.8 | 2.8 | 3.5 | 3.1 |
| 2 | 3.3 | 3 | 3.6 | 3.7 | 3.1 | 4.2 |
| 3 | 1.9 | 2.3 | 2 | 1.9 | 2.2 | 2.4 |
| 4 | 5.1 | 4.4 | 4.8 | 4.8 | 3.3 | 4.9 |
| 5 | 2.3 | 2.4 | 2.4 | 2.4 | 3 | 3.7 |
| 6 | 2.8 | 2.5 | 2.6 | 2.7 | 2.7 | 2.4 |
| 7 | 2.6 | 1.8 | 1.4 | 1.9 | 2.4 | 2.3 |
| 8 | 1.6 | 1.6 | 1.4 | 1.7 | 2.4 | 1.9 |
| 9 | 1.9 | 1.2 | 0.8 | 1.2 | 3.8 | 1.2 |
| 10 | 1.2 | 0.9 | 0.7 | 1.2 | 3 | 1.5 |

As shown in Table 1, the liquid state low-field NMR testing provides accurate estimations of natural rubber in tested plants as compared to other quantification methods such as Soxhlet and microwave extraction and solid state low-field NMR. A comparison of the average of the three Soxhlet extractions for each sample to the liquid state low-field NMR testing shows that the liquid state low-field NMR testing is within 23 percent of Soxhlet quantification. A comparison of the microwave extraction for each sample to the liquid state low-field NMR testing shows that the liquid state low-field NMR testing is within 17.5 percent of microwave quantification.

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting.

The invention claimed is:

1. A method for quantifying an amount of natural rubber in a rubber-containing plant by use of low-field NMR, comprising the steps of:
   a. introducing a sample solution comprising a sample portion of the plant, a solvent and a known amount of a non-polyisoprene standard rubber into a sample receiving space of a low-field NMR apparatus, and the low-field NMR apparatus operating at a magnetic field strength of 2 T or less for obtaining a NMR spectrum for the sample solution;
   b. obtaining a NMR spectrum of the sample solution, the NMR spectrum comprising a first signal peak corresponding to a single proton for the natural rubber present in the portion of the plant, the first signal peak having a first peak area, and a second signal peak corresponding to one or more protons for the non-polyisoprene standard rubber, the second signal peak having a second peak area;
   c. quantifying an amount of natural rubber in the portion of the plant by multiplying the first peak area by a conversion factor to obtain an estimate of the number of moles of natural rubber in the plant portion, the conversion factor being the number of moles of the non-polyisoprene standard rubber in the sample solution divided by the second peak area divided by the number of protons corresponding to the second signal peak.

2. The method of claim 1, further comprising the step of quantifying an amount of natural rubber in the sampled rubber-containing plant by dividing the quantified amount of natural rubber in the portion of the plant by the weight of the portion of the plant to obtain a natural rubber per weight factor and multiplying the natural rubber per weight factor by the total weight of the sampled rubber-containing plant.

3. The method of claim 2, the plant being guayule and the amount of quantified natural rubber in the sampled rubber-containing plant being the amount of extractable natural rubber contained the guayule plant being tested.

4. The method of claim 1, further comprising comparing the amount of quantified natural rubber to a pre-determined threshold amount of rubber and making a decision to harvest the rubber-containing plant being tested.

5. The method of claim 1, further comprising comparing the amount of quantified natural rubber to a pre-determined threshold amount of rubber and making a decision to breed the rubber-containing plant being tested.

6. The method of claim 1, the method being non-destructive to the plant wherein the portion of the plant used in the sample receiving space of the low-field NMR apparatus to quantify an amount of natural rubber in the plant is less than 5 weight percent of the plant.

7. The method of claim 1, the low-field NMR apparatus operating at a magnetic field strength of 1.5 T or less for obtaining the NMR spectrum for the sample solution.

8. The method of claim 1, the low-field NMR apparatus operating at a frequency of 90 MHz less for obtaining the NMR spectrum for the sample solution.

9. The method of claim 1, the method being performed on the sample solution in less than 10 minutes.

10. The method of claim 1, the rubber-containing plant being guayule and the non-polyisoprene standard rubber being polybutadiene.

11. The method of claim 1, the solvent being a deuterated solvent containing an internal standard.

12. The method of claim 10, the portion of the plant having at least 1 weight percent resin based on the total weight of the portion of the plant in the sample solution introduced into the receiving space of the low-field NMR apparatus.

13. A non-destructive method for quantifying an amount of natural rubber in a guayule plant by use of low-field NMR, comprising the steps of:
   a. introducing a sample solution into a sample receiving space of a low-field NMR apparatus, the sample solution consists of a solvent and a dissolved plant sample of the guayule plant, the dissolved plant sample consisting of a dried and ground up portion of the guayule plant, and a pre-determined known amount of moles of a non-polyisoprene standard rubber component, and the low-field NMR apparatus operating at a magnetic field strength of 2 T or less for obtaining a NMR spectrum for the sample solution;
   b. obtaining a NMR spectrum for the sample solution, the NMR spectrum comprising a first signal peak corresponding to a single proton position for the natural rubber present in the plant sample of the guayule plant, the first signal peak having a first peak area, and a second signal peak corresponding to one or more protons for the non-polyisoprene standard rubber component, the second signal peak having a second peak area;
   c. quantifying the number of moles of the natural rubber in the guayule plant by multiplying the first peak area by a conversion factor to obtain an estimate of the number of moles of natural rubber in the plant sample, the conversion factor being the number of moles of the non-polyisoprene standard rubber component in the sample solution divided by the second peak area divided by the number of protons corresponding to the second signal peak.

14. A non-destructive method for quantifying an amount of natural rubber in a guayule plant by use of low-field NMR, comprising the steps of:
   a. introducing a sample solution into a sample receiving space of a low-field NMR apparatus, the sample solution consisting of a solvent and a dissolved plant sample of the guayule plant, the plant sample comprising natural rubber and resin and being a dried and milled portion of the guayule plant, and a pre-determined known amount of moles of a standard high cis 1,4-polybutadiene rubber, and the low-field NMR apparatus operating at a magnetic field strength of 2 T or less for obtaining a NMR spectrum for the sample solution;
   b. obtaining a NMR spectrum for the sample solution, the NMR spectrum comprising a first signal peak corresponding to a single proton position for the natural rubber present in the plant sample of the guayule plant, the first signal peak having a first peak area, and a second signal peak corresponding to one or more protons for the standard high cis 1,4-polybutadiene rubber component, the second signal peak having a second peak area;
   c. quantifying the number of moles of the natural rubber in the guayule plant by multiplying the first peak area by a conversion factor to obtain an estimate of the number of moles of natural rubber in the plant sample, the conversion factor being the number of moles of the standard high cis 1,4-polybutadiene rubber component in the sample solution divided by the second peak area divided by the number of protons corresponding to the second signal peak, the method being performed on the sample solution in less than 10 minutes.

15. The method of claim 14, further comprising deciding to harvest the guayule plant by comparing step (c) to a natural rubber harvesting threshold.

16. The method of claim 15, further comprising extracting the natural rubber from the harvested guayule plant.

17. The method of claim 14, the portion of the plant having at least 1 weight percent resin based on the total weight of the portion of the plant in the sample solution introduced into the receiving space of the low-field NMR apparatus.

18. The method of claim 14, the solvent being a deuterated solvent.

19. The method of claim 14, the method being performed on the sample solution in less than 5 minutes.

* * * * *